(12) United States Patent
Sivakumar et al.

(10) Patent No.: US 6,968,532 B2
(45) Date of Patent: Nov. 22, 2005

(54) MULTIPLE EXPOSURE TECHNIQUE TO PATTERN TIGHT CONTACT GEOMETRIES

(75) Inventors: Swaminathan (Sam) Sivakumar, Portland, OR (US); Rex K. Frost, Hillsboro, OR (US); Phi Nguyen, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/682,367

(22) Filed: Oct. 8, 2003

(65) Prior Publication Data

US 2005/0081178 A1    Apr. 14, 2005

(51) Int. Cl.[7] .............................................. G06F 17/50
(52) U.S. Cl. ........................................ 716/21; 716/19
(58) Field of Search ................... 716/19–21; 430/1, 430/5, 7, 22, 30

(56) References Cited

U.S. PATENT DOCUMENTS

| | | | |
|---|---|---|---|
| 6,444,483 B1 * | 9/2002 | Minemura et al. | 438/24 |
| 6,553,562 B2 * | 4/2003 | Capodieci et al. | 716/19 |
| 6,635,392 B2 * | 10/2003 | Okada et al. | 430/5 |
| 6,738,859 B2 * | 5/2004 | Liebchen | 716/19 |
| 2002/0166107 A1 * | 11/2002 | Capodieci et al. | 716/19 |
| 2004/0003368 A1 * | 1/2004 | Hsu et al. | 716/19 |
| 2004/0010770 A1 * | 1/2004 | Broeke et al. | 716/21 |

* cited by examiner

*Primary Examiner*—Vuthe Siek
*Assistant Examiner*—Binh Tat
(74) *Attorney, Agent, or Firm*—Fish & Richardson P.C.

(57) ABSTRACT

A mask pattern may be decomposed into two or more masks, each having a pitch greater than that of the original mask pattern. New, "partial-pattern" masks may be created for each of the new mask patterns. The original mask pattern is transferred to the photoresist for the corresponding layer using a multiple exposure technique in which the photoresist is exposed with each of the partial-pattern masks individually, e.g., back-to-back in a pass through a scanner, to define all of the features in the original pattern.

25 Claims, 5 Drawing Sheets

MULTIPLE EXPOSURE TECHNIQUE TO PATTERN TIGHT CONTACT GEOMETRIES

BACKGROUND

A binary or phase shift photomask may include glass and chrome features which form a pattern. Light may pass through the clear glass areas and be blocked by the opaque chrome areas. Light that passes through the mask may continue into an imaging system that projects an image of the mask pattern onto a wafer. The wafer may be coated with a photosensitive film (photoresist), which undergoes a chemical reaction when exposed to light. After exposure, in a "positive" photoresist, the areas on the photoresist exposed to the light may be removed in a developing process, leaving the unexposed areas as features on the wafer. Alternatively, in a "negative" photoresist, the areas on the photoresist shielded from the light may be removed in a developing process, leaving the exposed areas as features on the wafer.

"Pitch" refers to the center-to-center distance between features in a pattern. The resolution of an imaging system determines the smallest pitch the system can resolve. If the pitch of the original pattern exceeds the resolution limits of the system, e.g., is too small, the pattern may not be clearly defined on the photoresist. This may produce defects in the final product.

DETAILED DESCRIPTION

Figure 1:
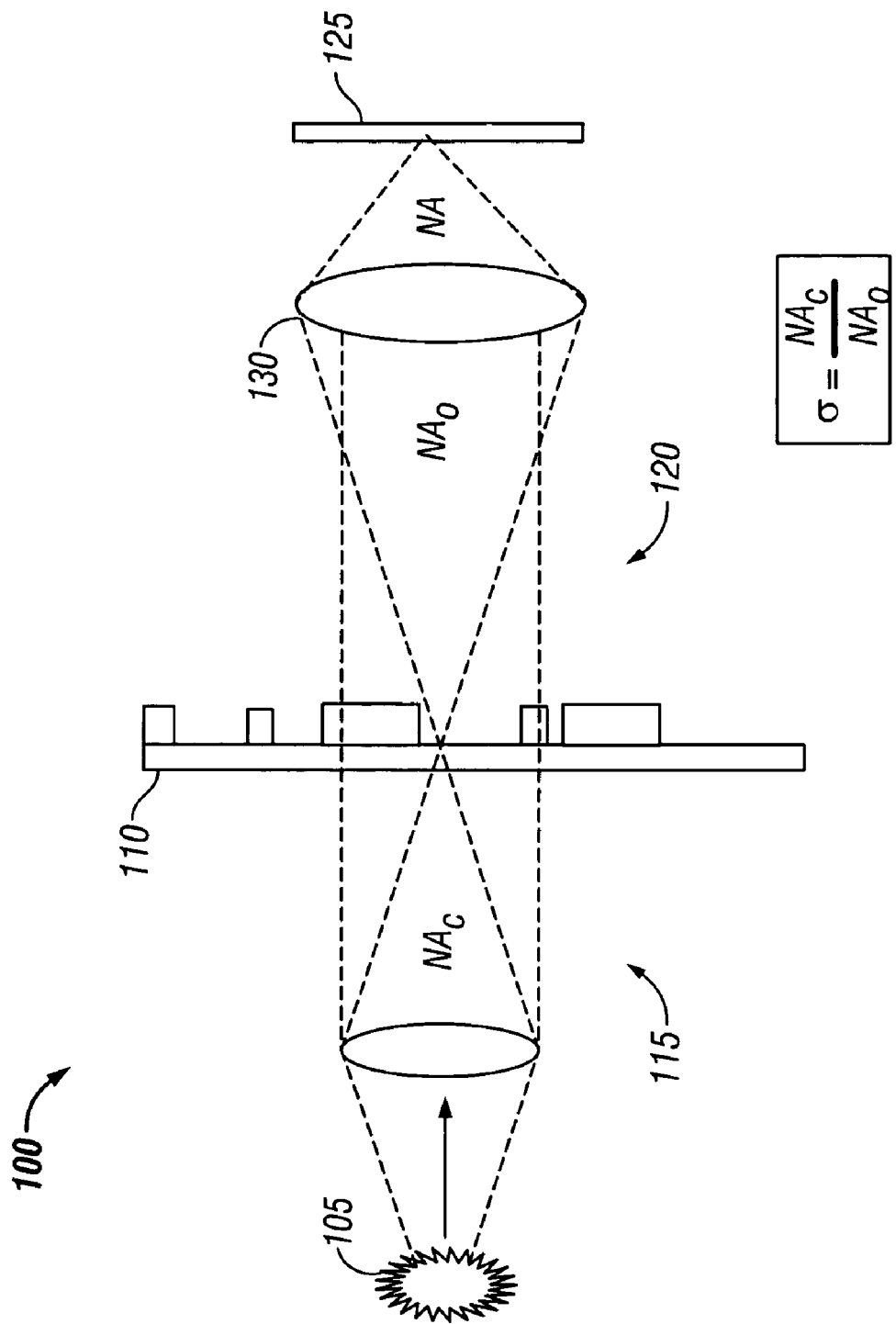
FIG. 1 is a block diagram of an optical lithography system.

FIG. 1 shows an optical lithography system 100, which may be used to manufacture integrated circuit (ICs), or "chips." Light from an illumination source 105 is transferred to a patterned mask 110 (or reticle) by an illumination system 115. Light passes through the mask 110 and into the entrance pupil of an imaging system 120. The resulting pattern is imaged onto a photoresist-covered wafer 125 by a lens 130 in the imaging system. After exposure, the wafer 125 is baked and developed, leaving regions covered by photoresist and complementary regions that are not covered. These features may be used to produce circuit components on the wafer. After several more semiconductor processing steps, including multiple additional imaging operations, the wafer may be diced into a batch of ICs.

The ICs created on the wafer may include many different layers. These layers may include metallization layers, polysilicon layers, barrier layers, etc. The different layers may have different patterns which may define circuit components such as transistors, contacts, vias, and wiring. The different patterns may be imaged by different masks in a series of imaging operations.

Figure 2:
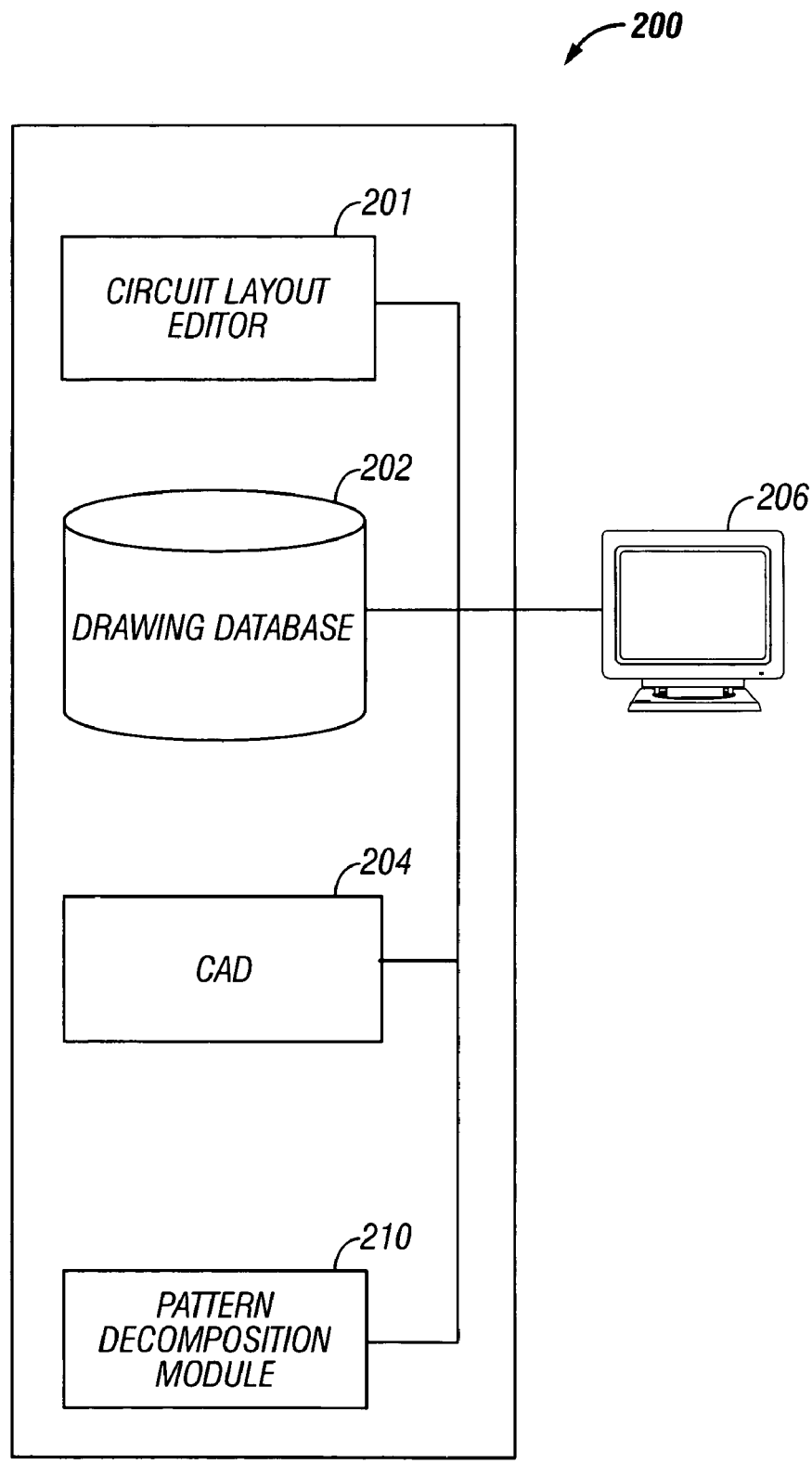
FIG. 2 is a block diagram of a circuit layout editor system.

FIG. 2 shows a circuit layout editor system 200 which may be used by a designer to develop a circuit layout for a multi-layered IC. The system may include a circuit layout editor 201, a database 202 in which data representing circuit components is stored, and a computer-aided design (CAD) system 204, which enables the designer to represent the multi-layer circuit layout on a display screen 206. The circuit layout may be displayed as an array of different colored objects, some of which may be stacked on top of others. Different colors may be assigned to different objects and/or different layers to provide a better three-dimensional representation. The colors serve as unique identifiers, and may correspond to numerical identifiers associated with the object in the database.

A circuit layout generated by the circuit layout editor system 200 may be used to make the various masks which are used to image the patterns on the different IC layers. The information in the layout may be extracted from the database 202, formatted, and sent to a mask production system. The mask production system may use the data to make the different masks. The mask production system may make openings in a chrome layer on a glass wafer in accordance with a pattern defined by the circuit layout data. The chrome regions define the opaque portions of the pattern and the openings (bare glass) define the transmissive portions of the pattern. In a phase shift mask, e.g., an alternating phase shift mask (APSM), the glass in the openings may have different phase step heights, which form, e.g., zero (0°) and pi (180°) apertures.

The imaging system 120 has a resolution which determines the precision of the pattern that the system can effectively image. "Pitch" refers to the center-to-center distance between features in a pattern. If the pitch on one or more of the masks exceeds the resolution limits of the imaging system (e.g., is too small), the features may not be successfully imaged, and the resulting circuit components may be defective.

In an embodiment, a pattern decomposition module 210 in the circuit layout editor system 200 may decompose a mask pattern into two or more masks, each having a pitch greater than that of the original mask pattern. New, "partial-pattern" masks are created for each of the new mask patterns. The original mask pattern is transferred to the photoresist for the corresponding layer using a multiple exposure technique in which the photoresist is exposed with each of the partial-pattern masks individually, e.g., back-to-back in a pass through a scanner, to define all of the features in the original pattern.

This multiple exposure technique may be useful for layers that contain extremely tight pitches, e.g., pitches that exceed the resolution limits of the imaging system, and relatively uncomplicated geometries.

Figure 3:
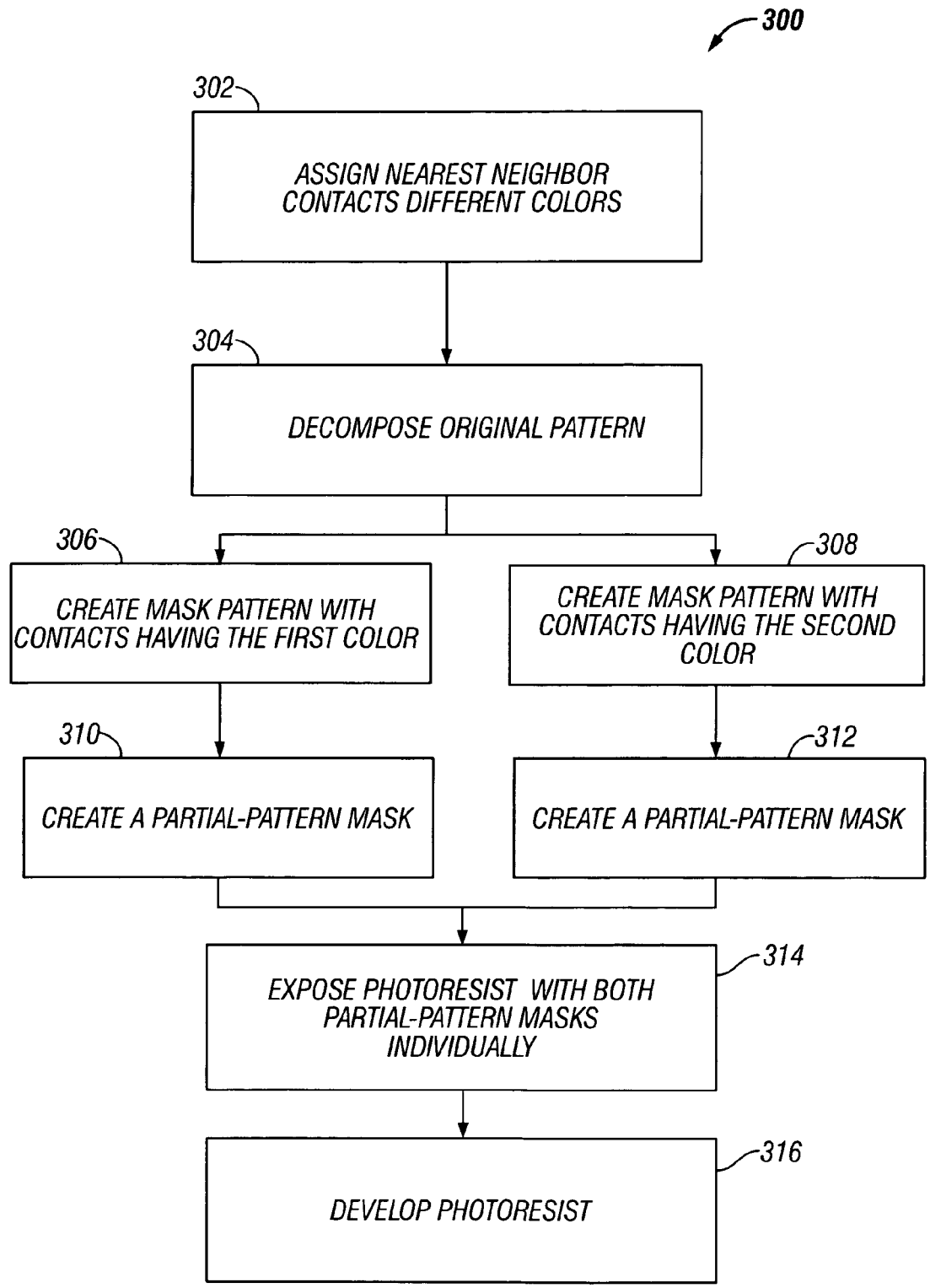
FIG. 3 is a flowchart describing a dual exposure operation for printing a contact layer pattern.

FIG. 3 is a flowchart describing a dual exposure operation 300 for a contact layer in an IC. In an embodiment, a mask pattern for the contact layer with a given pitch is decomposed into two masks, each with a pitch approximately double that of the given pitch.

Figure 4:
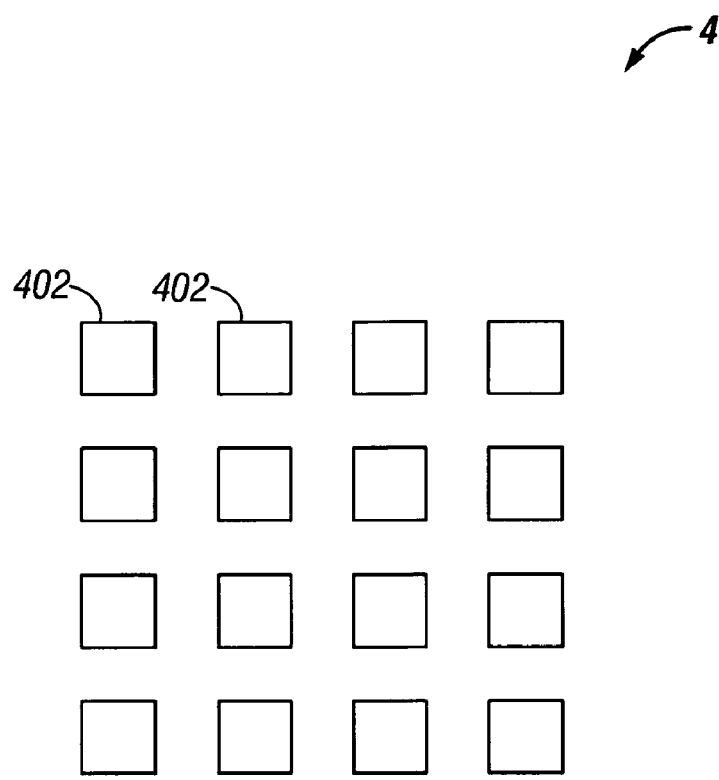
FIG. 4 illustrates an exemplary contact layer pattern.

In this example, the imaging system 120 may have a resolution sufficient for imaging pitches down to about 200 nm. FIG. 4 shows an exemplary original mask pattern 400 for the contact layer. The pattern includes an array of contacts 402, which correspond to square holes in the opaque chrome layer of the mask. Data corresponding to the contacts may be stored in the database 202 and may include, for example, dimensions, coordinates, and identifiers, e.g., color identifiers.

Figure 5:
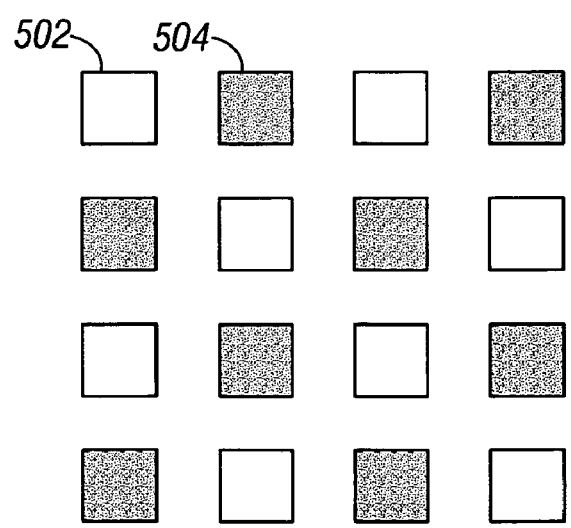
FIG. 5 illustrates a coloring technique for decomposing the pattern of FIG. 4.
Figure 6A:
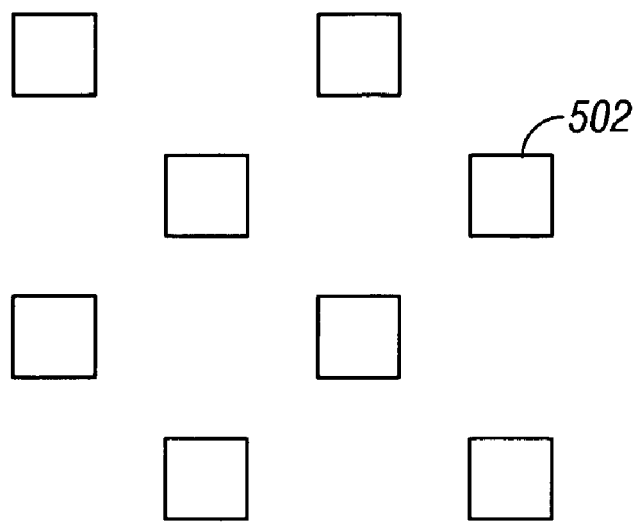
FIGS. 6A and 6B show partial-pattern masks corresponding to the pattern of FIG. 4.
Figure 6B:
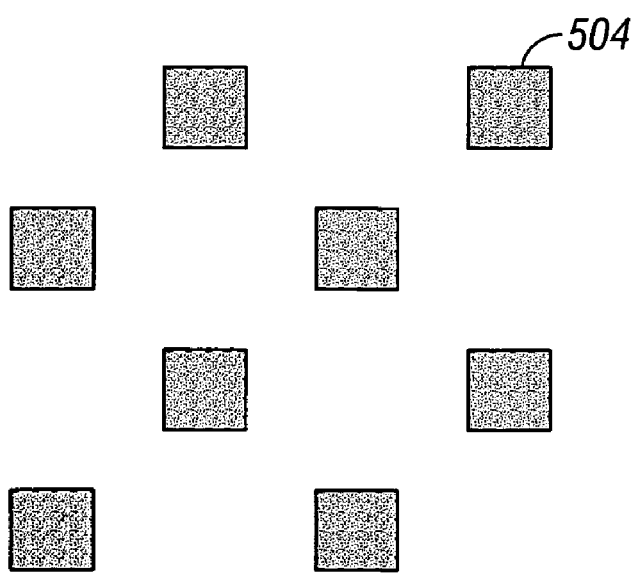

A "coloring" scheme may be applied to data on the contact layer, where nearest neighbor contacts are assigned different colors, e.g., white 502 and black 504 (block 302), as shown in FIG. 5. The mask pattern may be decomposed into two mask patterns (block 304). The decomposition process may include creating one mask pattern with the contacts assigned the first color (white) 502 (block 306), and creating another mask pattern with contacts assigned the second color (black) 504 (block 308), as shown in FIGS. 6A and 6B, respectively. Each of the two mask patterns have a pitch that is approximately 300 nm, which is double that of the original mask pattern and well within the resolution limits of the imaging system 120 (i.e., 200 nm in this example).

Two partial-pattern masks are then generated, one for each color of contacts (blocks 310 and 312, respectively). The photoresist may be exposed with each of the partial-pattern masks individually, e.g., back-to-back in a pass through the scanner, to define all of the features in the original pattern (block 314). The photoresist may then be developed (block 316).

The technique described above may be advantageous for contact layers, because the contacts may have simple geometries (e.g., square holes) and patterns which may lend themselves to straightforward algorithms for decomposing the pattern. The technique may also be used for other layers, however more complex patterns may require more complex algorithms to effectively decompose the patterns. The technique may also be used for features having different geometries, e.g., lines and spaces.

In an embodiment, a mask pattern may be decomposed into more than two patterns for an even greater effective increase in pitch. However, this may entail additional exposure processes, which may introduce additional alignment errors and decrease throughput in the lithography system.

The technique described above may be a more effective and less expensive option for resolving extremely tight pitches than other options, such as high NA (Numerical Aperture) optics, strong off-axis illumination, or extremely high performance (and expensive) photoresists.

A number of embodiments have been described. Nevertheless, it will be understood that various modifications may be made without departing from the spirit and scope of the invention. For example, blocks in the flowchart may be skipped or performed out of order and still produce desirable results. Accordingly, other embodiments are within the scope of the following claims.

What is claimed is:

1. A method comprising:
    receiving a first mask pattern, the first mask pattern including a plurality of features to be patterned on a particular substrate layer;
    decomposing the first mask pattern into two or more second mask patterns, each of said second mask patterns including a portion of said plurality of features, wherein one of the two or more second mask patterns is to be included in a first mask to pattern some of the plurality of features on the particular substrate layer, and a different one of the two or more second mask patterns is to be included in a second mask separate from the first mask to pattern others of the plurality of features on the particular substrate layer, and wherein the pitch of at least one of the second mask patterns is approximately two or more times greater than the pitch of the first mask pattern.

2. The method of claim 1, wherein said decomposing comprises:
    assigning different identifiers to different groups of features in the first mask pattern.

3. The method of claim 2, wherein said assigning comprises assigning different identifiers to adjacent features.

4. The method of claim 2, wherein assigning different identifiers comprises assigning different colors to different features in the first mask pattern.

5. The method of claim 2, wherein each of the two or more second mask patterns includes features in a corresponding one of the different groups.

6. The method of claim 1, further comprising:
    generating the first mask and the second mask.

7. The method of claim 6, further comprising:
    transferring the first mask pattern to the particular layer using at least the first mask and the second mask, wherein the particular layer comprises photoresist.

8. The method of claim 7, wherein said transferring comprises exposing the photoresist to each of the first mask and the second mask.

9. The method of claim 1, wherein the first mask pattern comprises a mask pattern corresponding to a contact layer.

10. The method of claim 1, wherein a pitch of the first mask pattern exceeds a resolution limit of an imaging system, and
    wherein the pitch of each of the two or more second mask patterns is within the resolution limit of the imaging system.

11. An article comprising a machine-readable medium including machine-executable instructions operative to cause a machine to:
    receive information indicative of a first mask pattern, the first mask pattern including a plurality of features to be patterned on a particular substrate layer;
    decompose the information indicative of the first mask pattern into information indicative of two or more second mask patterns, each of said second mask patterns including a portion of said plurality of features, wherein one of the two or more second mask patterns is to be included in a first mask to pattern some of the plurality of features on the particular substrate layer, and a different one of the two or more second mask patterns is to be included in a second mask separate from the first mask, and wherein the pitch of at least one of the second mask patterns is approximately two or more times greater than the pitch of the first mask pattern.

12. The article of claim 11, wherein the instructions for said decomposing comprise instructions operative to cause the machine to assign different identifiers to different groups of features in the first mask pattern.

13. The article of claim 12, wherein the instructions for said assigning comprise instructions operative to cause the machine to assign different identifiers to adjacent features.

14. The article of claim 12, wherein the instructions for said assigning different identifiers comprise instructions operative to cause the machine to assign different colors to different features in the first mask pattern.

15. The article of claim 12, wherein each of the two or more second mask patterns includes features in a corresponding one of the different groups.

16. An apparatus comprising:
    a storage device including data corresponding to features in a first mask pattern having a pitch;
    a pattern decomposition module operative to decompose the first mask pattern having a pitch into two or more second mask patterns, each of said second mask patterns including a portion of the plurality of features, wherein one of the two or more second mask patterns is to be included in a first mask, and a different one of the two or more second mask patterns is to be included in a second mask separate from the first mask, and wherein the pitch of at least one of the second mask patterns is approximately two or more times greater than the pitch of the first mask pattern.

17. The apparatus of claim 16, wherein the storage device is a database.

18. The apparatus of claim 16, wherein the data corresponding to features includes coordinates and identifiers for the features.

19. The apparatus of claim 16, wherein the pattern decomposition module is operative to assign different identifiers to different groups of features in the first mask pattern.

20. The apparatus of claim 19, wherein the pattern decomposition module is operative to assign different identifiers to adjacent features.

21. The apparatus of claim 19, wherein the pattern decomposition module is operative to assign different colors to different features in the first mask pattern.

22. The apparatus of claim 19, wherein each of the two or more mask patterns includes features in a corresponding one of the different groups.

23. An imaging system comprising:
a first mask, the first mask including a first portion of a mask pattern to be transferred to a particular photoresist layer;
a second mask separate from the first mask, the second mask including a second portion of the mask pattern to be transferred to the particular photoresist layer,
wherein the pitch of the first portion and the pitch of the second portion are approximately two or more times greater than the pitch of the mask pattern to be transferred to the particular photoresist layer.

24. The imaging system of claim 23, wherein the pitch of the mask pattern is less than a resolution limit of the lithography system, and wherein the pitch of the first portion is greater than or equal to the resolution limit of the lithography system.

25. The imaging system of claim 24, wherein the pitch of the second portion is greater than or equal to the resolution limit of the lithography system.

* * * * *